(12) United States Patent
Jang et al.

(10) Patent No.: US 9,712,151 B2
(45) Date of Patent: Jul. 18, 2017

(54) METHOD, APPARATUS AND SYSTEM FOR AN EDGE RATE CONTROLLED OUTPUT BUFFER

(71) Applicant: Texas Instruments Incorporated, Dallas, TX (US)

(72) Inventors: Byungchul B. Jang, Allen, TX (US); Timothy B. Merkin, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/693,475

(22) Filed: Apr. 22, 2015

(65) Prior Publication Data

US 2015/0311893 A1    Oct. 29, 2015

Related U.S. Application Data

(60) Provisional application No. 61/983,276, filed on Apr. 23, 2014.

(51) Int. Cl.
*H03K 5/12*    (2006.01)
*H03K 17/16*    (2006.01)
*H03K 19/0185*    (2006.01)

(52) U.S. Cl.
CPC ....... *H03K 17/161* (2013.01); *H03K 19/0185* (2013.01)

(58) Field of Classification Search
None
See application file for complete search history.

(56) References Cited

U.S. PATENT DOCUMENTS 6,850,100 B2 *    2/2005    Takeshita .............. H03K 17/166
                                                           327/112

* cited by examiner

*Primary Examiner* — Cassandra Cox
(74) *Attorney, Agent, or Firm* — Michael A. Davis, Jr.; Charles A. Brill; Frank D. Cimino

(57) ABSTRACT

A circuit for minimizing variation over process, voltage and temperature for edge rate over and propagation delay. The circuit includes at least two first buffers for decoupling large nonlinear parasitic capacitors of the main drivers, at least two second buffers for level shifting to the at least two first buffers, at least two voltage sources for initializing the stage of at least one of the first or the second buffer, and a current source generator coupled to the voltage source of the second buffers.

3 Claims, 5 Drawing Sheets

METHOD, APPARATUS AND SYSTEM FOR AN EDGE RATE CONTROLLED OUTPUT BUFFER

CROSS REFERENCES TO RELATED APPLICATIONS

This application claims priority from U.S. Provisional Patent Application No. 61/983,276 filed on Apr. 23, 2014, which is hereby incorporated by reference in its entirety.

BACKGROUND

Technical Field

This relates generally to a method, apparatus and system for an edge rate controlled output buffer.

Description of Related Art

Traditionally, low power and low voltage edge rate controlled buffers are inverter based output buffers. Such buffers tend to have high current peak due to shoot-through current, inductive supply noise due to large voltage drop, and electromagnetic interference (EMI) due to high output edge switching rates.

It is also challenging to control edge rate over PVT, due to non-linear edge rate behavior that is variable over process, voltage and temperature (PVT). Current approaches show input current signal dependent propagation delay, which creates large and unexpected mismatch between falling and rising transition.

FIG. 1 depicts a prior art approach using inverter staggered type edge rate. In such an approach, a precise clock scheme is needed to control accurate edge rate. In addition, the open-loop approach of FIG. 1 is not suitable for large load change requirement, because it is difficult to have load independent control. As a result, the edge rate varies not only input control signal, but also capacitive load.

FIG. 2 depicts another prior art approach to implement for input current, $T_{IN1}$ and $I_{IN2}$. Utilizing a simple feedback based buffer and having large Cdg non-linear capacitance of MP and MN causes the slope to be non-linear with a constant input signal. Hence, a large feedback capacitor ($C_F$>>Cdg) must be used along with the large input current signal. This requires silicon large area and often creates large propagation delay in order to drive a large linear feedback capacitor $C_F$. Since there is no direct charge initialization of the feedback capacitor $C_F$, the startup voltage mismatch between the drivers (MP or MN) and the feedback initial voltage creates signal dependent propagation delay. This signal dependent delay will cause the crossing point distortion in an eye diagram test. As a result, the approach of FIG. 2 is unable to accurately initialize feedback capacitance over PVT in order to achieve signal insensitive propagation delay.

Therefore, there is a need for an accurate and improved control edge rate control over process, voltage and temperature that minimizes signal dependent startup time in order to achieve good signal integrity.

SUMMARY

Embodiments include a circuit for minimizing variation over process, voltage and temperature for edge rate and propagation delay. The circuit includes at least two first buffers for decoupling large nonlinear parasitic capacitors of the main drivers, at least two second buffers for level shifting to the at least two first buffers, at least two voltage sources for initializing the stage of at least one of the first or the second buffer, and a current source generator coupled to the voltage source of the second buffers.

BRIEF DESCRIPTION OF THE DRAWINGS

The appended drawings illustrate example embodiments.

DETAILED DESCRIPTION

Embodiments include a method, apparatus and system of insensitive parasitic capacitance of drivers for low voltage, low power applications that accurately control edge rate over process and temperature and provide for a signal independent propagation delay to help maintain good differential signal integrity.

Figure 1:
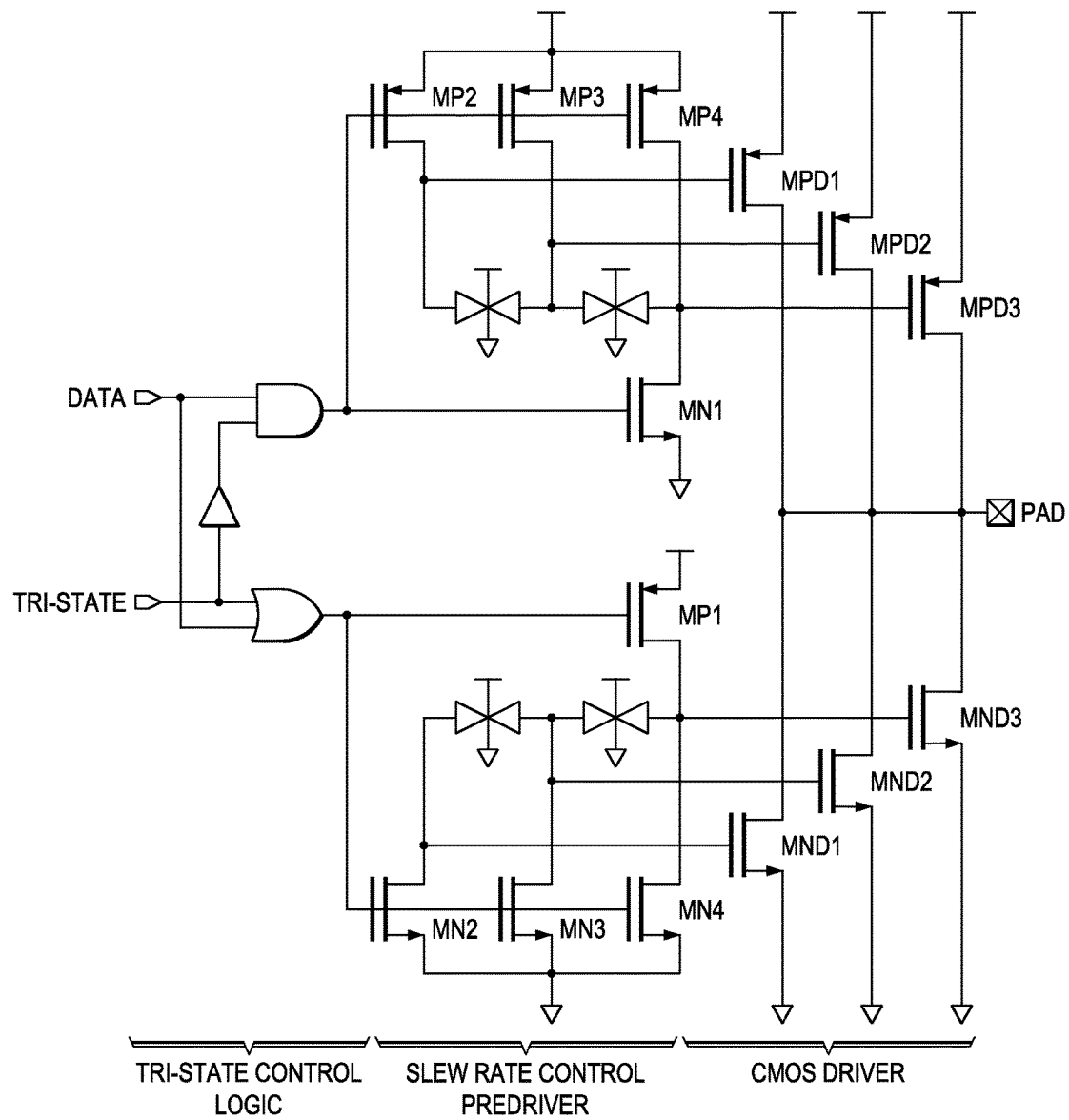
FIG. 1 depicts a prior art approach using inverter staggered type edge rate.
Figure 2:
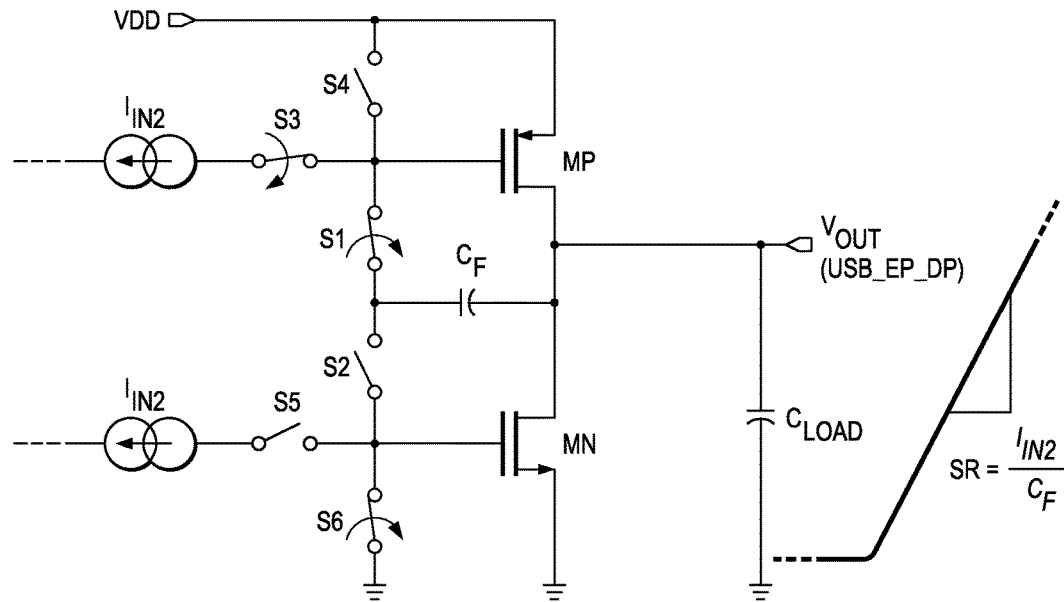
FIG. 2 depicts another prior art approach using a separate feedback capacitor for MP and MN.
Figure 3:
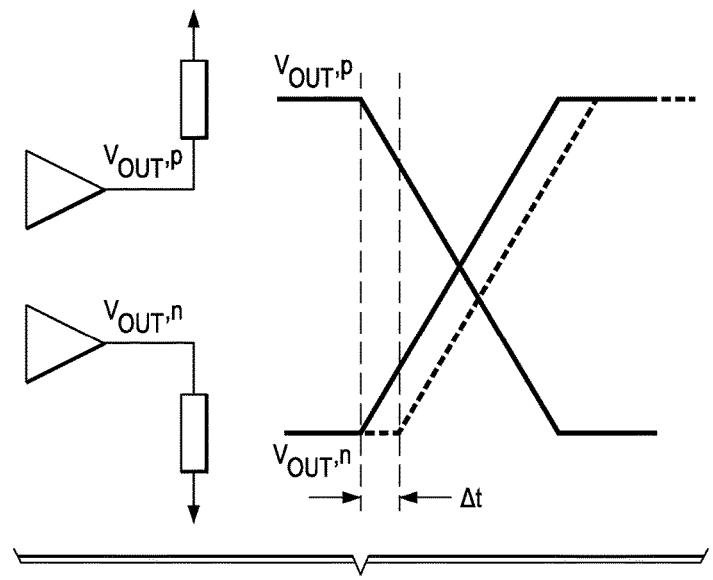
FIG. 3 depicts two buffers generating differential signaling.

FIG. 3 depicts two buffers generating differential signaling, with different startup times of drivers causing the crossing point to shift. As shown in FIG. 3, "turning on" time mismatch will largely vary the crossing point when two buffers generate differential signaling. Traditionally, trimming the input current does not solve the problem. In some cases, it may alleviate the trimming; however, it will vary over process, voltage and temperature (PVT). This also causes the crossing point distortion, which is undesirable.

In differential signaling, the crossing point (of two signals Vout,p and Vout,n of FIG. 3): should not vary much over process, supply voltage, and temperature; and is desirably in the middle of a valid supply range for good signal integrity. In one example, if trimming is used to meet edge rate specifications, then time delay may be associated with this trimming. This delay associated with trimming may affect the startup time of the amplifier, such that the crossing point may not occur at the desired crossing point range. In addition, this delay will vary across PVT.

Figure 4:
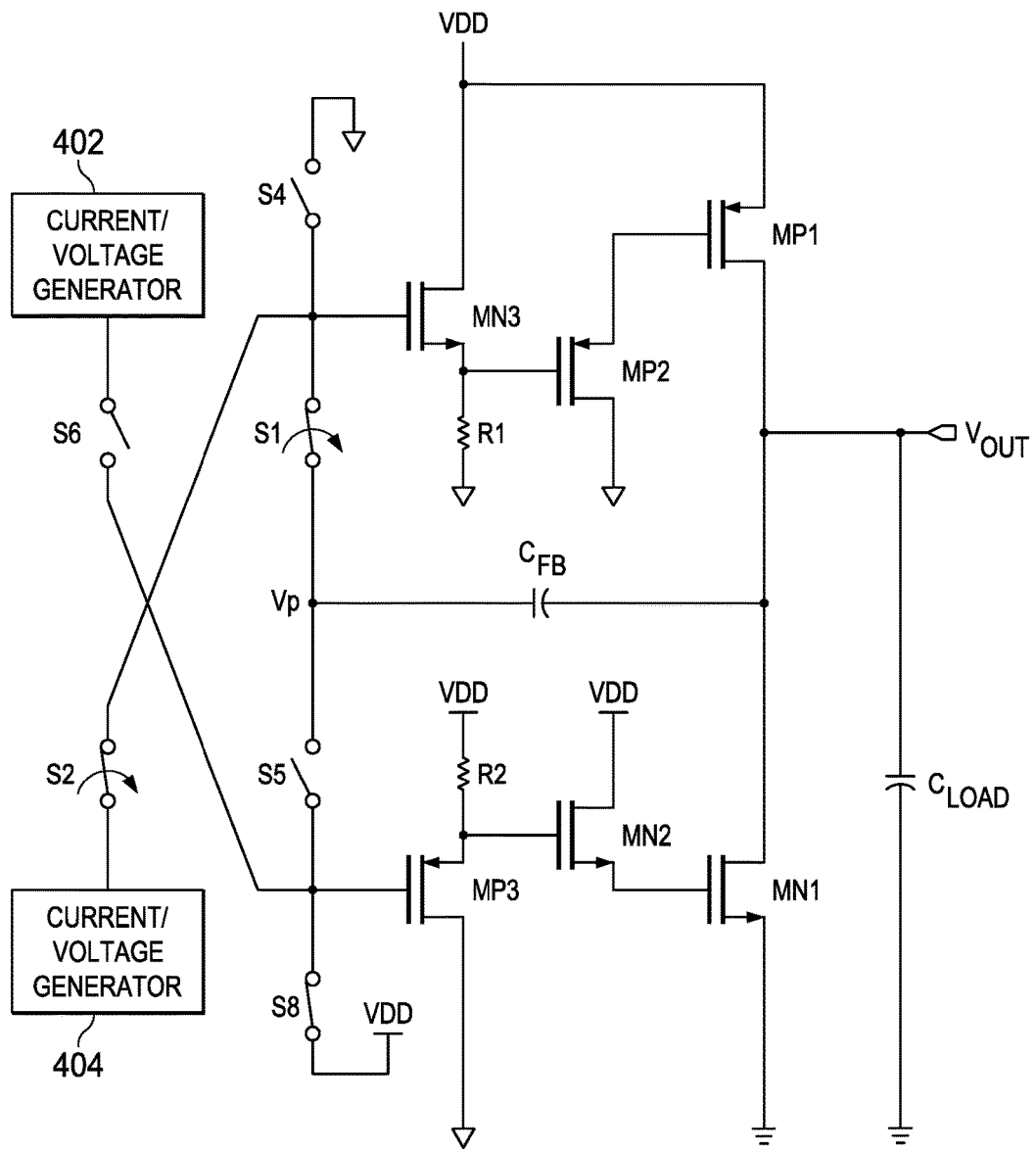
FIG. 4 depicts an edge rate controlled output driver circuit of example embodiments.
Figure 5A:
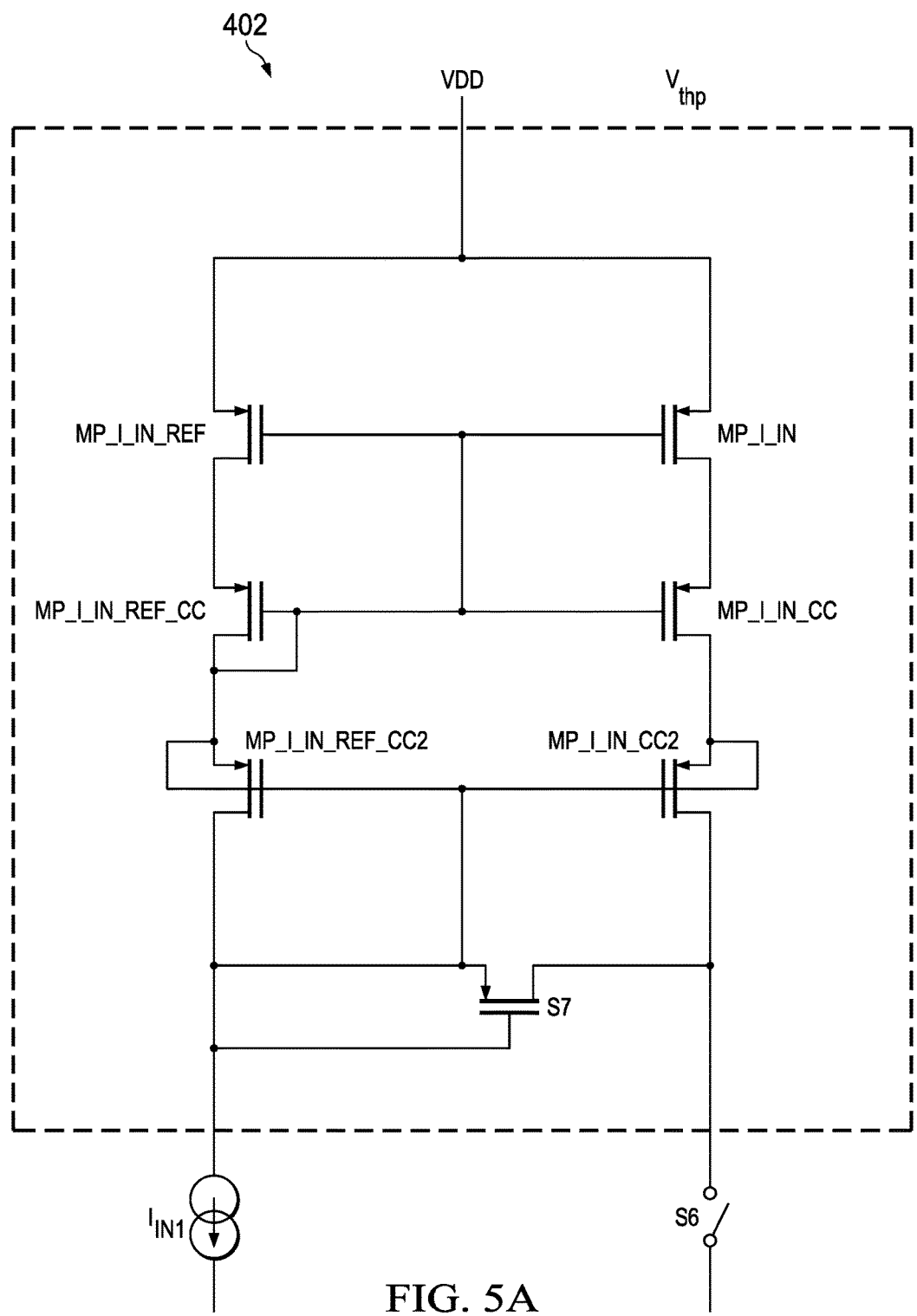
FIGS. 5A and 5B respectively depict a first current/voltage generator and a second current/voltage generator of the edge rate controlled output driver circuit of FIG. 4.
Figure 5B:
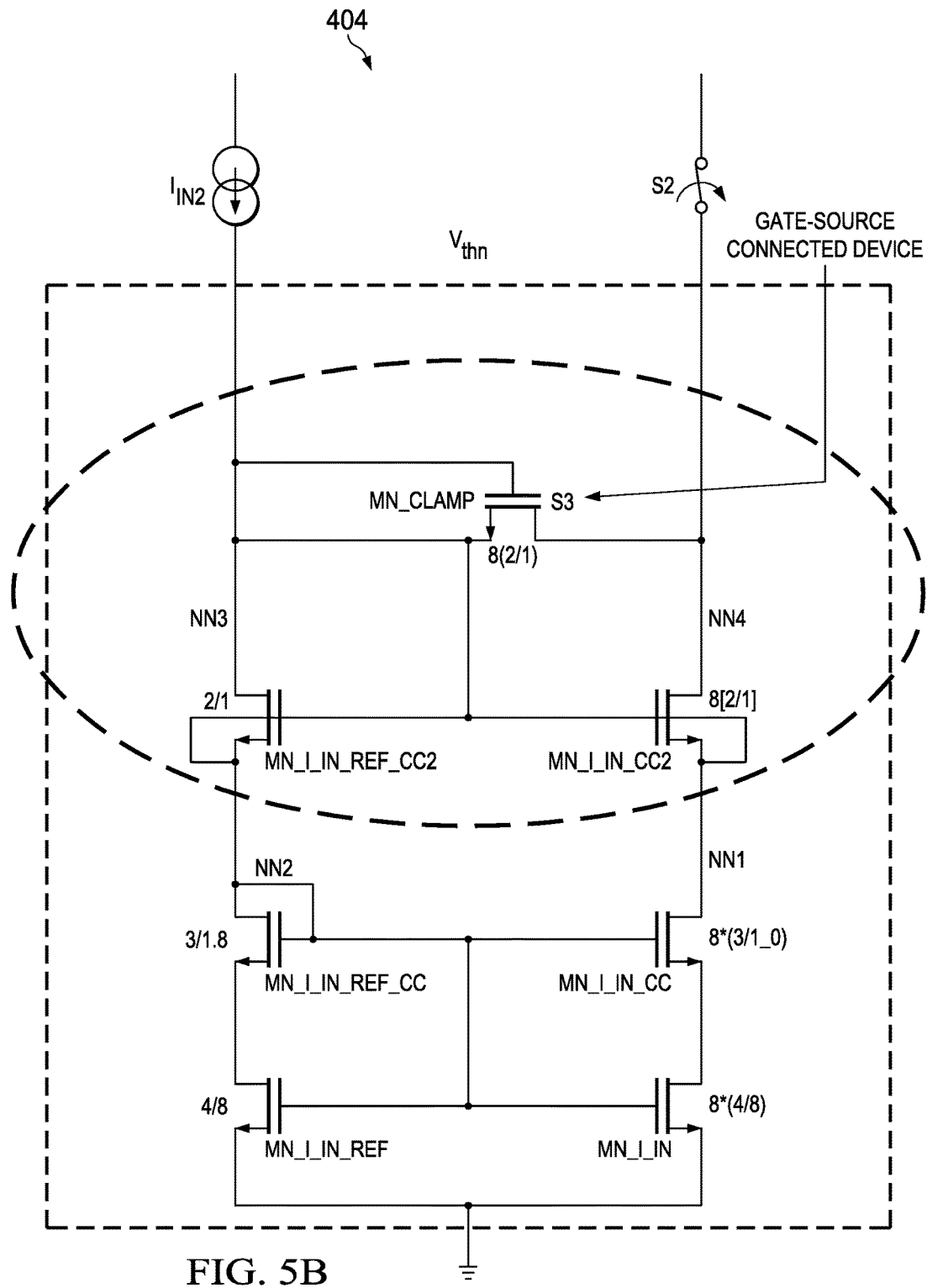

FIG. 4 depicts an edge rate controlled output driver circuit of example embodiments. FIG. 5A depicts a current/voltage generator 402 of FIG. 4. FIG. 5B depicts a current/voltage generator 404 of FIG. 4. The circuit of FIG. 4 has four states, which are:

State0: Low to high voltage transition of $V_{OUT}$, in which only S1, S2, S8 and S7 (FIG. 5A) switches are closed, State1: High voltage output of $V_{OUT}$, in which only S1, S2, S3 (FIG. 5B) and S8 switches are closed (Vp=Vthn), State2: High to low voltage transition of $V_{OUT}$, in which only S5, S6, S3 (FIG. 5B) and S4 switches are closed, and State3: Low voltage output of $V_{OUT}$, in which only S5, S6, S7 (FIG. 5A) and S4 switches are closed (Vp=VDD−Vthp).

In order to remove signal dependent propagation delay and to minimize propagation delay, Vp is equal to VDD−Vthp at the beginning of State0, and Vp is equal to Vthn at the beginning of State2.

In FIG. 4, MN2 and MP2 are buffers, which are used to decouple large nonlinear parasitic Cgd of each driver MN1/

MP1 from $C_{FB}$ (e.g., Cdg>5-10×$C_{FB}$). MN3 and MP3 are also buffers, which are used for level shifting to help in low voltage applications (canceling the required voltage due to the buffers MN2 and MP2). The gate-source voltages of MN2/MP3 (and of MP2/MN3) are largely canceling out each other, so that the node Vp provides the required gate-source voltage of drivers MN1/MP1.

In one embodiment, the current/voltage generator (402 or 404) may convert from operating as a current generator ($I_{IN1}$ or $I_{IN2}$) to operating as a voltage generator, after $V_{OUT}$ rails out. This is achieved by cascoding device with gate-source connected device. For example, referring to FIG. 5B, S3 is activated when S1 (FIG. 4) and S2 are closed. Also, referring to FIG. 4, MP1 and $C_{FB}$ form capacitive feedback amplifier with a constant current to generate desired slew control of $V_{OUT}$. The node Vp is constant during the slew controlled swing region because the circuit works as an integrator. After $V_{OUT}$ swing reaches the positive rail (VDD), the switch S3 (FIG. 5B) is turned on, and Vp node voltage is defined as being near Vthn (e.g., MN1 device threshold voltage) rather than ground. Alternatively, if there were no gate-source connected device, then Vp node voltage would be near ground, so that the voltage across the feedback capacitor $C_{FB}$ would be VDD, after $V_{OUT}$=VDD.

In one embodiment, S3 switch action is automatic and implemented in the same gate-source connected device to initialize charges on the feedback capacitor $C_{FB}$ for signal independent startup of the drivers. For example, after Vp node voltage goes below the current reference voltage, the gate-source connected device becomes a diode-connected device, such that Vp node voltage is defined as being near Vthn (e.g., MN1 device threshold voltage), after $V_{OUT}$=VDD (as described in the immediately preceding paragraph). MN1 driver will be turned on during the next state, so the initial voltage (VDD−Vthn) across the feedback capacitor $C_{FB}$ is desired to remove signal dependent startup.

The circuit of FIG. 4 benefits from controlling the edge rate of output signals that are generated by a transmitter or driver to eliminate any high order of harmonics to reduce EMI/EMC emission. The following are examples of such systems: USB 1.1 and USB 2.0 type of signaling drivers or any edge rate controlled digital data communication physical layer drivers, any capacitive touch screen controller drivers, and the like.

FIG. 5B shows the gate-source connected device S3, which will be in "Off state" during transition. After $V_{OUT}$ rails out and is ready for the next state, the gate-source connected device S3 cancels the gate-source voltage of MN_I_IN_REF_CC2, so that the Vp node voltage is defined as being near Vthn. MN1 and the current source $I_{IN2}$ include the same type of device, so their threshold voltages can track well over PVT. As described hereinabove, for turning MN1 on, the Vp node voltage is initialized to be near Vthn, which avoids the need to equalize the charge stored on the feedback capacitor $C_{FB}$. As a result, the MN1 amplifier has a quick startup (turning on) time with no signal dependent propagation delay.

Example embodiments help to minimize variation over PVT for edge rate and propagation delay. As a result, the improved circuit leads to a robust solution over PVT, signal independent propagation delay, low quiescent current consumption, low supply solution, insensitivity to nonlinear driver device capacitance, small form-factor, load insensitive edge rate control, minimization of undesirable handoff transient response, etc.

While the foregoing is directed to example embodiments, other and further embodiments are possible, within the scope of the claims.

What is claimed is:

1. Circuitry for driving an output node, the circuitry comprising:
    a first output transistor having: a drain coupled to the output node; and a source coupled to a high voltage node having a high voltage; wherein the first output transistor is coupled to drive the output node to approach the high voltage while a first switch is closed;
    a second output transistor having: a drain coupled to the output node; and a source coupled to a low voltage node having a low voltage; wherein the second output transistor is coupled to drive the output node to approach the low voltage while a second switch is closed;
    a first current/voltage generator coupled through at least the first switch to: a gate of the first output transistor; and a control node;
    a second current/voltage generator coupled through at least the second switch to: a gate of the second output transistor; and the control node; and
    a capacitor coupled between the control node and the output node;
    wherein, while the first switch is closed, the first current/voltage generator is coupled to operate as: a first current generator while the first output transistor transitions the output node from near the low voltage to approach the high voltage; and a first voltage generator to keep the control node near a threshold voltage of the second output transistor while the output node is near the high voltage; and
    wherein, while the second switch is closed, the second current/voltage generator is coupled to operate as: a second current generator while the second output transistor transitions the output node from near the high voltage to approach the low voltage; and a second voltage generator to keep the control node near a threshold voltage of the first output transistor while the output node is near the low voltage.

2. The circuitry of claim 1, further comprising:
    at least one first buffer, coupled between the first switch and the gate of the first output transistor, to decouple a parasitic capacitance of the first output transistor from the capacitor; and
    at least one second buffer, coupled between the second switch and the gate of the second output transistor, to decouple a parasitic capacitance of the second output transistor from the capacitor.

3. The circuitry of claim 1, wherein:
    the at least one first buffer includes: a first buffer transistor to decouple the parasitic capacitance of the first output transistor from the capacitor; and a second buffer transistor to level shift between voltages at the gate of the first output transistor and a gate of the first buffer transistor; and
    the at least one second buffer includes: a third buffer transistor to decouple the parasitic capacitance of the second output transistor from the capacitor; and a fourth buffer transistor to level shift between voltages at the gate of the second output transistor and a gate of the third buffer transistor.

* * * * *